US012610779B2

(12) United States Patent
Kuo et al.

(10) Patent No.: US 12,610,779 B2
(45) Date of Patent: Apr. 21, 2026

(54) WORKING SYSTEM FOR SEMICONDUCTOR PACKAGING PROCESS AND OPERATION METHOD THEREOF

(71) Applicant: SILICONWARE PRECISION INDUSTRIES CO., LTD., Taichung City (TW)

(72) Inventors: Tang-Hsin Kuo, Taichung City (TW); Chin-Chih Hsiao, Taichung City (TW); Hung-Wen Chien, Taichung City (TW); I Hsu, Taichung City (TW)

(73) Assignee: SILICONWARE PRECISION INDUSTRIES CO., LTD., Taichung City (TW)

( * ) Notice: Subject to any disclaimer, the term of this patent is extended or adjusted under 35 U.S.C. 154(b) by 446 days.

(21) Appl. No.: 18/323,741

(22) Filed: May 25, 2023

(65) Prior Publication Data

US 2024/0266197 A1    Aug. 8, 2024

(30) Foreign Application Priority Data

Feb. 4, 2023    (TW) ................................. 112104005

(51) Int. Cl.
*H10P 72/30*        (2026.01)
*H10P 72/00*        (2026.01)
*H10P 72/76*        (2026.01)

(52) U.S. Cl.
CPC ...... *H10P 72/3218* (2026.01); *H10P 72/0456* (2026.01); *H10P 72/0464* (2026.01); *H10P 72/3404* (2026.01); *H10P 72/3411* (2026.01); *H10P 72/7602* (2026.01)

(58) Field of Classification Search
CPC ........... H01L 21/6773; H01L 21/67173; H01L 21/67196; H01L 21/67769; H01L 21/67778; H01L 21/68707; H01L 21/67276; H01L 21/67727; H01L 21/67775; H10P 72/3218; H10P 72/0456; H10P 72/0464; H10P 72/3404; H10P 72/3411; H10P 72/7602; H10P 72/0612; H10P 72/3216; H10P 72/3408
See application file for complete search history.

(56) References Cited

U.S. PATENT DOCUMENTS

| | | | | |
|---|---|---|---|---|
| 2001/0014267 A1 * | 8/2001 | Yamaga | ............ | H01L 21/67265 |
| | | | | 414/217 |
| 2009/0092468 A1 * | 4/2009 | Oyama | ............ | H01L 21/67017 |
| | | | | 414/222.01 |
| 2010/0003111 A1 * | 1/2010 | Yeo | ................... | H01L 21/67769 |
| | | | | 414/222.07 |

(Continued)

FOREIGN PATENT DOCUMENTS

| | | | | | |
|---|---|---|---|---|---|
| JP | 2022057798 A | * | 4/2022 | ....... | H01L 21/67751 |

*Primary Examiner* — Glenn F Myers
(74) *Attorney, Agent, or Firm* — Studebaker Brackett PLLC

(57) ABSTRACT

A working system for a semiconductor packaging process includes a machine equipment, a supply unit and a return device. The supply unit is correspondingly connected to the machine equipment and includes an input device and an output device. The return device is connected to the input device and the output device. As such, a magazine is transferred from the input device to the output device via the return device, thereby accelerating the operation speed of a production line.

20 Claims, 10 Drawing Sheets

(56)              References Cited

U.S. PATENT DOCUMENTS

2015/0340253  A1*  11/2015  Oosterlaken ...... H01L 21/67736
                                                    414/172
2020/0206788  A1*   7/2020  Kuwahara ......... H01L 21/67775

* cited by examiner

S310

A magazine of an input device is in an empty box state

S320

Transfer the emptied magazine to an output device via a
return device

S330

Move the magazine that has completed a loading
operation of the output device to an automatic handling
system via a pick-and-place device

WORKING SYSTEM FOR SEMICONDUCTOR PACKAGING PROCESS AND OPERATION METHOD THEREOF

BACKGROUND

1. Technical Field

The present disclosure relates to an equipment for semi-conductor packaging process, and more particularly, to a working system for a semiconductor packaging process and an operation method thereof.

2. Description of Related Art

With the vigorous development of the electronic industry, electronic products are gradually developing toward the trend of multi-function and high performance. Technologies currently applied in the field of chip packaging include flip-chip packaging modules such as chip scale package (CSP), direct chip attached (DCA), multi-chip module (MCM), or the like.

At present, in the machine equipment of a single process workstation of the packaging production line, empty maga-zine is manually moved to the material-releasing/material-unloading place to wait and carry the processed material after the material is fed or loaded; or, in the material handling operation of multiple workstations connected to each other, the magazine loaded with the processed material of the previous process operation is also manually moved to the workstation of the next process operation.

However, in the conventional packaging production line of electronic products, the production line flow is fitful and the production efficiency is low since the magazine is manually moved. Further, during the material delivery of a single workstation or multiple workstations connected to each other, a lot of manpower is wasted and time-consuming for each process operation (as such, the labor cost is very high), and even workers are prone to human errors due to long hours of work, thereby resulting in defective electronic products.

Therefore, how to overcome the aforementioned draw-backs of the prior art has become an urgent issue to be addressed at present.

SUMMARY

In view of the various shortcomings of the prior art, the present disclosure provides a working system for a semi-conductor packaging process, the working system com-prises: a machine equipment defined with a process starting end, a process ending end, and a process path connected to the process starting end and the process ending end; a supply unit correspondingly connected to the machine equipment and including an input device connected to the process starting end of the machine equipment and an output device connected to the process ending end of the machine equip-ment, wherein the input device is configured with a maga-zine for carrying a target material; and a return device connected to the input device and the output device to transport the magazine from the input device to the output device.

The present disclosure also provides an operation method of a working system for a semiconductor packaging process, the operation method of the working system comprises: providing the aforementioned working system; picking and placing the magazine from an automatic handling system into the input device; transferring the target material in the magazine to the process path of the machine equipment via the input device, so that the machine equipment processes the target material; transporting the magazine from the input device to the output device via the return device; moving the target material processed by the machine equipment to the output device via the output device; loading the processed target material into the magazine in the output device via the output device; and moving the magazine with the processed target material in the output device to the automatic handling system.

In the aforementioned working system and operation method, the input device has at least one load port, and the magazine is moved from the automatic handling system to the input device via the load port, and the return device is connected to the load port to transport the magazine from the load port to the output device. For instance, the input device further has at least one first distributor that cooperates with operation of the machine equipment, and the target material in the magazine is transferred to the process path of the machine equipment. Moreover, the input device further has at least one first operation area, and the magazine is moved to the first operation area via the load port, such that the target material in the magazine in the first operation area is processed by the first distributor. Furthermore, the input device has a first temporary storage port connected to the first operation area and the load port, and the magazine on the load port is moved to the first temporary storage port.

In the aforementioned working system and operation method, the input device has a return area connected to the return device, and the magazine is transported from the return area to the output device.

In the aforementioned working system and operation method, the output device has at least one unload port, and the magazine having the processed target material is output to the automatic handling system via the unload port, and the return device is connected to the unload port to transport the magazine from the input device to the unload port. For instance, the output device further has at least one second distributor that cooperates with operation of the machine equipment, and the target material processed by the machine equipment is moved to the output device. Further, the output device further has at least one second operation area con-nected to the unload port for placing the magazine, wherein the second distributor loads the processed target material into the magazine in the second operation area, and the magazine is moved to the unload port via the second operation area. In addition, the output device has a second temporary storage port connected to the second operation area and the unload port, and the magazine of the output device waiting to load the processed target material is temporarily stored in the second temporary storage port.

In the aforementioned working system and operation method, the output device has a return area, and the maga-zine is transported from the input device to the return area.

As can be seen from the above, in the working system for the semiconductor packaging process and the operation method thereof according to the present disclosure, by the design of the return device, the empty magazine of the input device is transferred to the output device, so as to wait for the loading operation to take place. Hence, compared with the manual method of the prior art, the working system of the present disclosure can save manpower because the return device is used to automatically transport the magazine in the empty box state to the material-releasing place after material feeding. In this way, the operation speed of the production line can be accelerated and the process cost can be reduced, which is beneficial to the mass production of the semiconductor product.

DETAILED DESCRIPTION

Figure 1A:
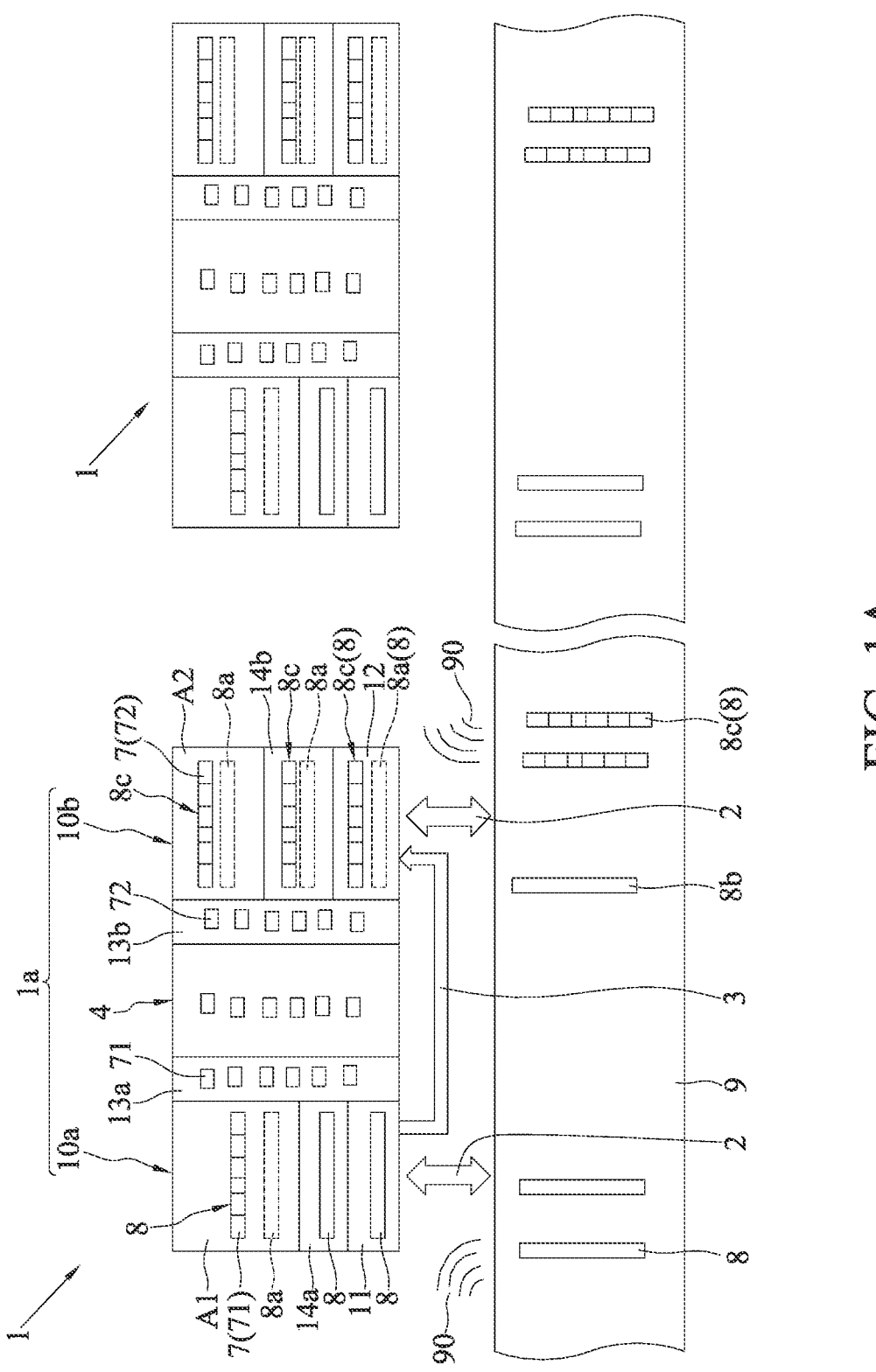
FIG. 1A is a schematic configuration view of a working system for a semiconductor packaging process according to the present disclosure on the production line.

The following describes the implementation of the present disclosure with examples. Those familiar with the art can easily understand the other advantages and effects of the present disclosure from the content disclosed in this specification.

It should be noted that the structures, ratios, sizes, etc. shown in the drawings appended to this specification are to be construed in conjunction with the disclosure of this specification in order to facilitate understanding of those skilled in the art. They are not meant to limit the implementations of the present disclosure, and therefore have no substantial technical meaning. Any modifications of the structures, changes of the ratio relationships, or adjustments of the sizes, are to be construed as falling within the range covered by the technical content disclosed herein to the extent of not causing changes in the technical effects created and the objectives achieved by the present disclosure. Meanwhile, terms such as "in," "on," "upper," "lower," "above," "below," "left," "right," "front," "behind," "first," "second," "a," "one," and the like are for illustrative purposes, and are not meant to limit the scope in which the present disclosure can be implemented. Any variations or modifications to their relative relationships, without changes in the substantial technical content, should also to be regarded as within the scope in which the present disclosure can be implemented.

Figure 4:
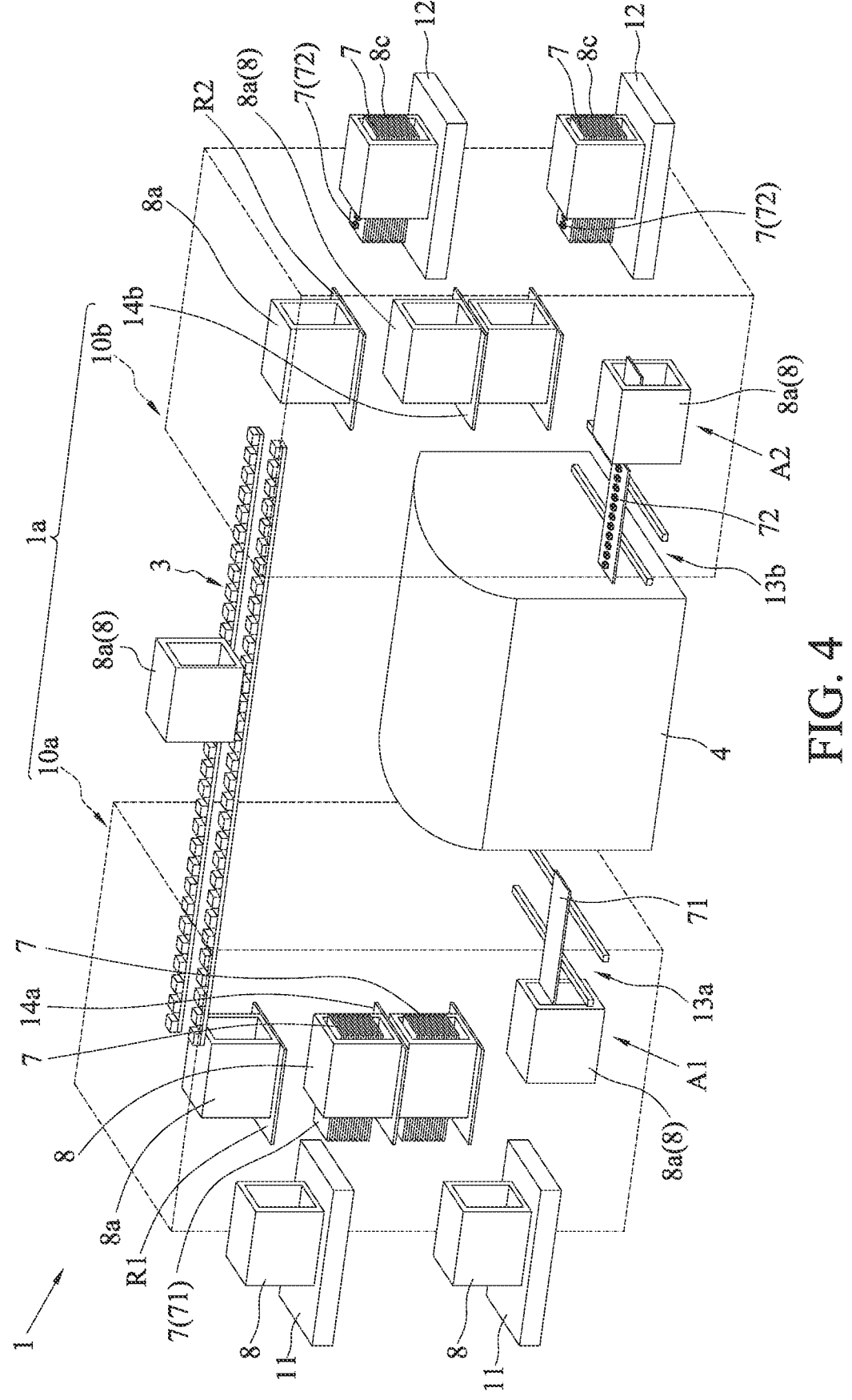
FIG. 4 is a schematic perspective view of the working system for the semiconductor packaging process according to the present disclosure on the production line.

FIG. 1A and FIG. 4 are schematic configuration views of a working system 1 of the present disclosure applied to a production line.

In an embodiment, the production line is a packaging production line for semiconductor products and is configured with an automatic handling system 9 (e.g., an automatic transport system) passing through a plurality of workstations, such that the automatic handling system 9 transports a magazine 8 between a plurality of workstations, and a single workstation is equipped with the working system 1 for performing one of the related processes of a semiconductor product. It should be understood that the processes of the plurality of workstations can be the same or different.

The automatic handling system 9 can be of an autonomous mobile robot (AMR), an overhead hoist transfer (OHT), or an overhead shuttle (OHS) specification. The automatic handling system 9 is communicatively connected to the working system 1 via a communication equipment 90 (such as of an E84 specification) to confirm the relevant information of that the transportation position is aligned with the workstation and the transported item (such as the magazine 8), so that the magazine 8 can be effectively moved from the automatic handling system 9 to the workstation, or moved from the workstation to the automatic handling system 9.

The magazine 8 is used to carry a target material 7 required by the semiconductor product and can even carry the target material 7 via at least one carrier. For instance, a plurality of carriers such as glass plates or temporary carrying plates can be arrayed in the magazine 8, and the target material 7 can be a material to be processed 71 or a processed material 72 of a semiconductor product.

As shown in FIG. 1A, the working system 1 comprises a machine equipment 4, at least one supply unit 1a (e.g., a supply device) correspondingly connected to the machine equipment 4, and at least one return device 3 connected to the supply unit 1a, wherein the supply unit 1a comprises an input device 10a and an output device 10b, and both the input device 10a and the output device 10b are configured with at least one magazine 8, such that the return device 3 is connected to the input device 10a and the output device 10b, wherein the working system 1 can be provided with at least one pick-and-place device 2 that cooperates with the operation of the automatic handling system 9 according to requirements, and the pick-and-place device 2 is used to input the magazine 8 to the input device 10a and/or output the magazine 8 from the output device 10b.

The machine equipment 4 is used to carry out one of the related processes of a semiconductor product, such as exposure, development, drilling, electroplating, ball placement, reflow, wire bonding, molding, grinding, chip placement, etc., and the present disclosure is not limited to as such. Further, the machine equipment 4 is defined with a process starting end, a process ending end and a process path connected to the process starting end and the process ending end.

In an embodiment, the input device 10a can be used as a material-feeding end relative to the machine equipment 4 to perform a material-feeding operation (e.g., a material-loading operation), and the output device 10b can be used as a material-releasing end relative to the machine equipment 4 to perform a material-releasing operation (e.g., a material-unloading operation), so that the input device 10a, the output device 10b and the machine equipment 4 can be operated separately, such that the material-feeding and material-releasing operations of the supply unit 1a do not need to interrupt the process operation of the machine equipment 4. Therefore, the waiting time of the automatic handling system 9 can be saved, and the utilization rate of the machine equipment 4 can be increased.

The input device 10a is connected to the process starting end of the machine equipment 4 and has at least one load port 11 and at least one first distributor 13a that cooperates with the operation of the machine equipment 4, and the output device 10b is connected to the process ending end of the machine equipment 4 and has at least one unload port 12 and at least one second distributor 13b that cooperates with the operation of the machine equipment 4. Further, the supply unit 1a can be configured with at least one operation area and at least one buffer port (e.g., a temporary storage port) according to requirements. On the other hand, as shown in FIG. 4, in an embodiment, the input device 10a can have two load ports 11, one of the load ports 11 (e.g., the lower load port 11) can be used for the automatic handling system 9 of the autonomous mobile robot (AMR) specification to place the magazine 8, and the other one of the load ports 11 (e.g., the upper load port 11) can be used for an overhead handling/transport system (such as the automatic handling system 9 of the overhead hoist transfer [OHT] or the overhead shuttle [OHS] specification) to place the magazine 8.

In an embodiment, the input device 10a can have at least one first operation area A1 connected to the load port 11, so that the magazine 8 is moved to the first operation area A1 via the load port 11 for the first distributor 13a to process the magazine 8 in the first operation area A1. On the other hand, the output device 10b can have at least one second operation area A2 connected to the unload port 12 for placing the magazine 8 for the second distributor 13b to process the magazine 8 in the second operation area A2, so that the magazine 8 is moved to the unload port 12 through the second operation area A2.

Moreover, the first distributor 13a is used to transfer the carrier and/or the material to be processed 71 in the magazine 8 into the machine equipment 4 through the first operation area A1. The first distributor 13a can use a push bar to push a plurality of the carriers and/or the materials to be processed 71 in the magazine 8 in the first operation area A1 to the first distributor 13a. In addition, the first distributor 13a uses a biaxial stepless moving structure to displace the plurality of carriers and/or materials to be processed 71 in a stepless biaxial manner, so that the carriers and/or the materials to be processed 71 can be precisely transported to the process path (such as a single-track or multi-track track structure) of the machine equipment 4. It should be understood that there are various movements of the biaxial stepless moving structure without special limitation.

Furthermore, the carrier and/or the target material 7 (such as the processed material 72) processed by the machine equipment 4 are moved to the second distributor 13b, and the second distributor 13b is used to move the carrier and/or the target material 7 (such as the processed material 72) that are processed to the second operation area A2. For instance, the second distributor 13b can displace the carrier and/or the target material 7 (such as the processed material 72) that are processed into the magazine 8 in the second operation area A2. It should be understood that the second distributor 13b can also use a push bar to push a plurality of the carriers and/or the target materials 7 (such as the processed materials 72) that are processed into the magazine 8 in the second operation area A2.

In addition, the input device 10a can be configured with a first temporary storage port 14a (e.g., a first buffer port) according to requirements, so that the first temporary storage port 14a is connected to the first operation area A1 and the load port 11, and the output device 10b can also be configured with a second temporary storage port 14b (e.g., a second buffer port) according to requirements, so that the second temporary storage port 14b is connected to the second operation area A2 and the unload port 12. It can be understood that when the supply unit 1a is configured with multiple temporary storage ports, a vertical multi-layer (as shown in FIG. 4, a plurality of first and second temporary storage ports 14a, 14b are arranged vertically) or horizontal storage method can be adopted. However, the horizontal storage method might increase the occupation area of the workstation in the factory area, i.e., a larger site space is required if the horizontal storage method is adopted.

The pick-and-place device 2 is disposed on the supply unit 1a to transport the magazine 8 between the automatic handling system 9 and the input device 10a and/or transport the magazine 8 between the automatic handling system 9 and the output device 10b.

In an embodiment, the pick-and-place device 2 moves the magazine 8 from the automatic handling system 9 to the load port 11, such that the magazine 8 is input to the input device 10a via the load port 11.

Moreover, the pick-and-place device 2 also outputs the magazine 8 in the output device 10b via the unload port 12, such that the magazine 8 on the unload port 12 is moved to the automatic handling system 9.

Figure 1B:
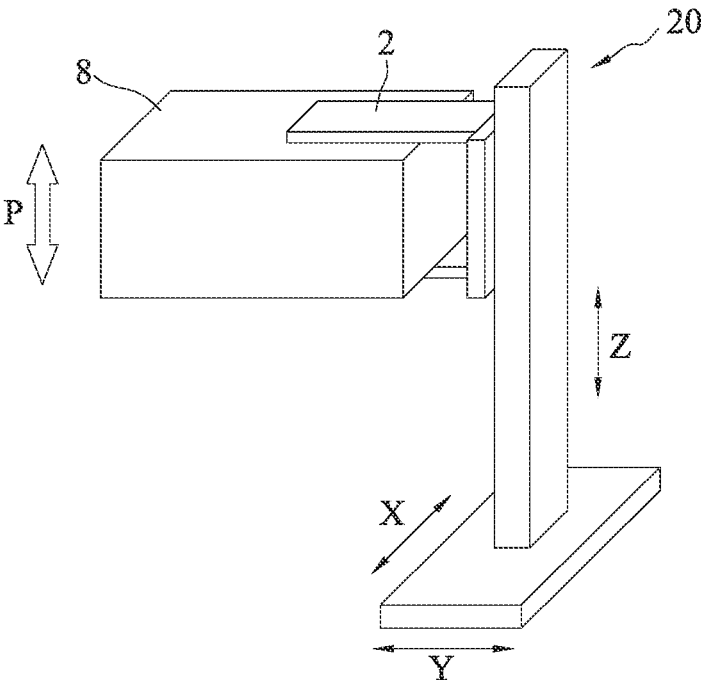
FIG. 1B, FIG. 1C, FIG. 1D, FIG. 1E and FIG. 1F are schematic perspective views illustrating different embodiments of a pick-and-place device of FIG. 1A.
Figure 1C:
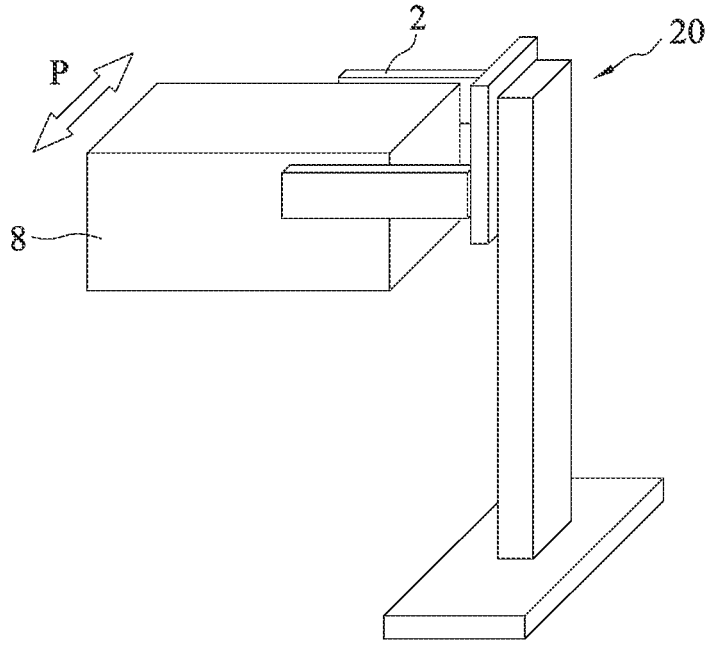
Figure 1D:
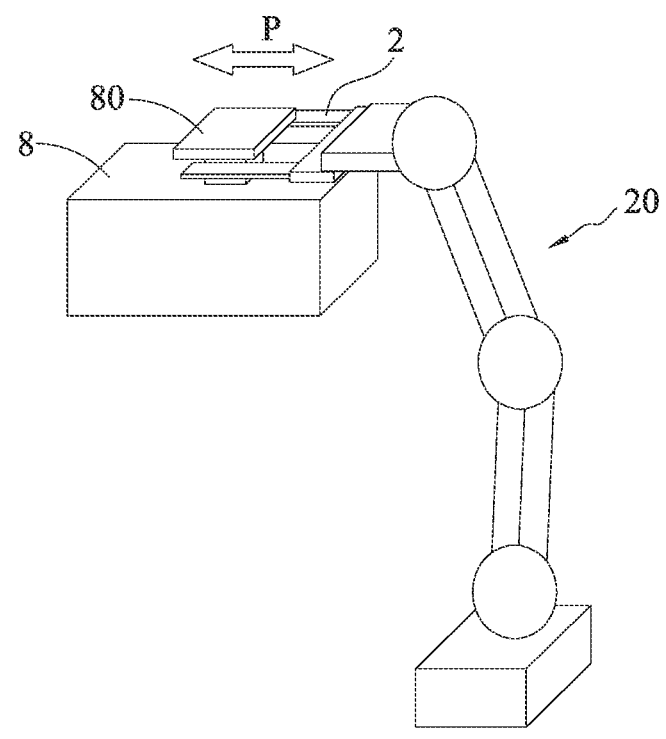
Figure 1E:
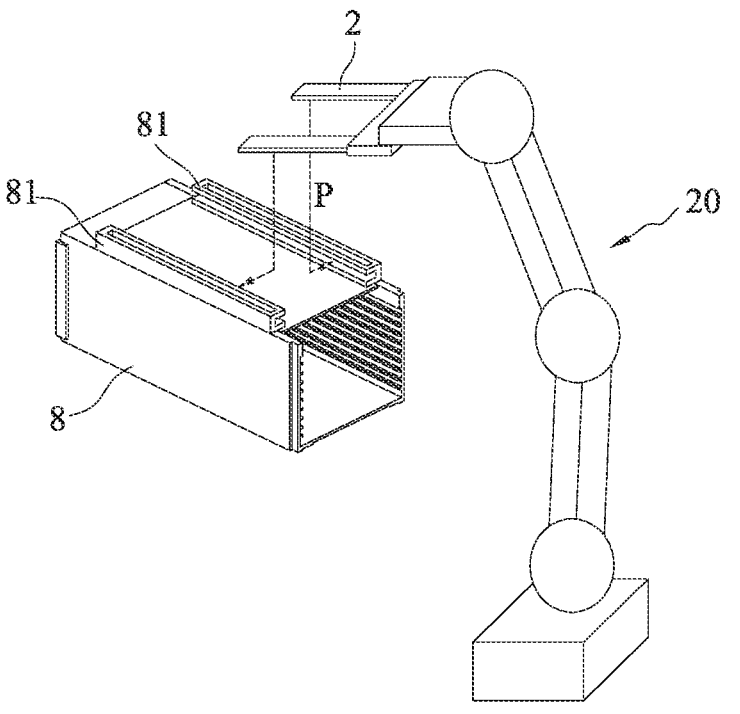
Figure 1F:
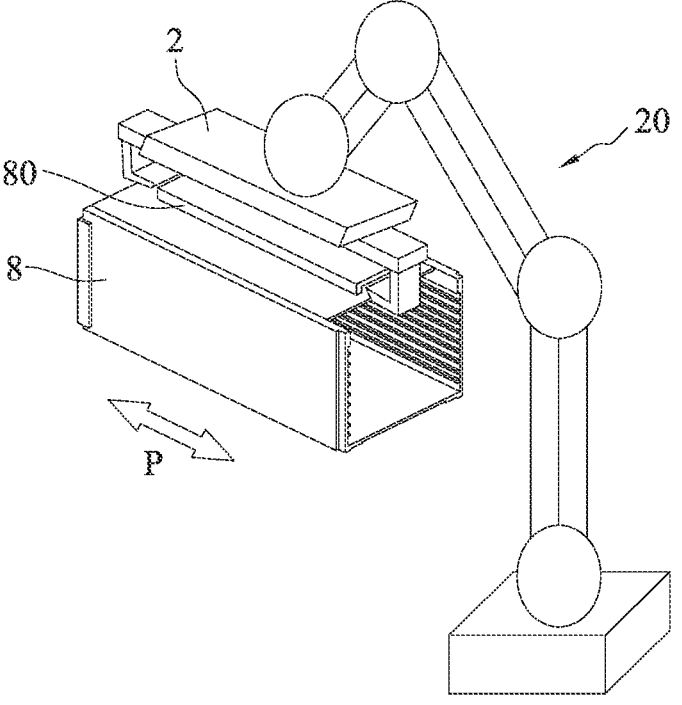
Figure 5:
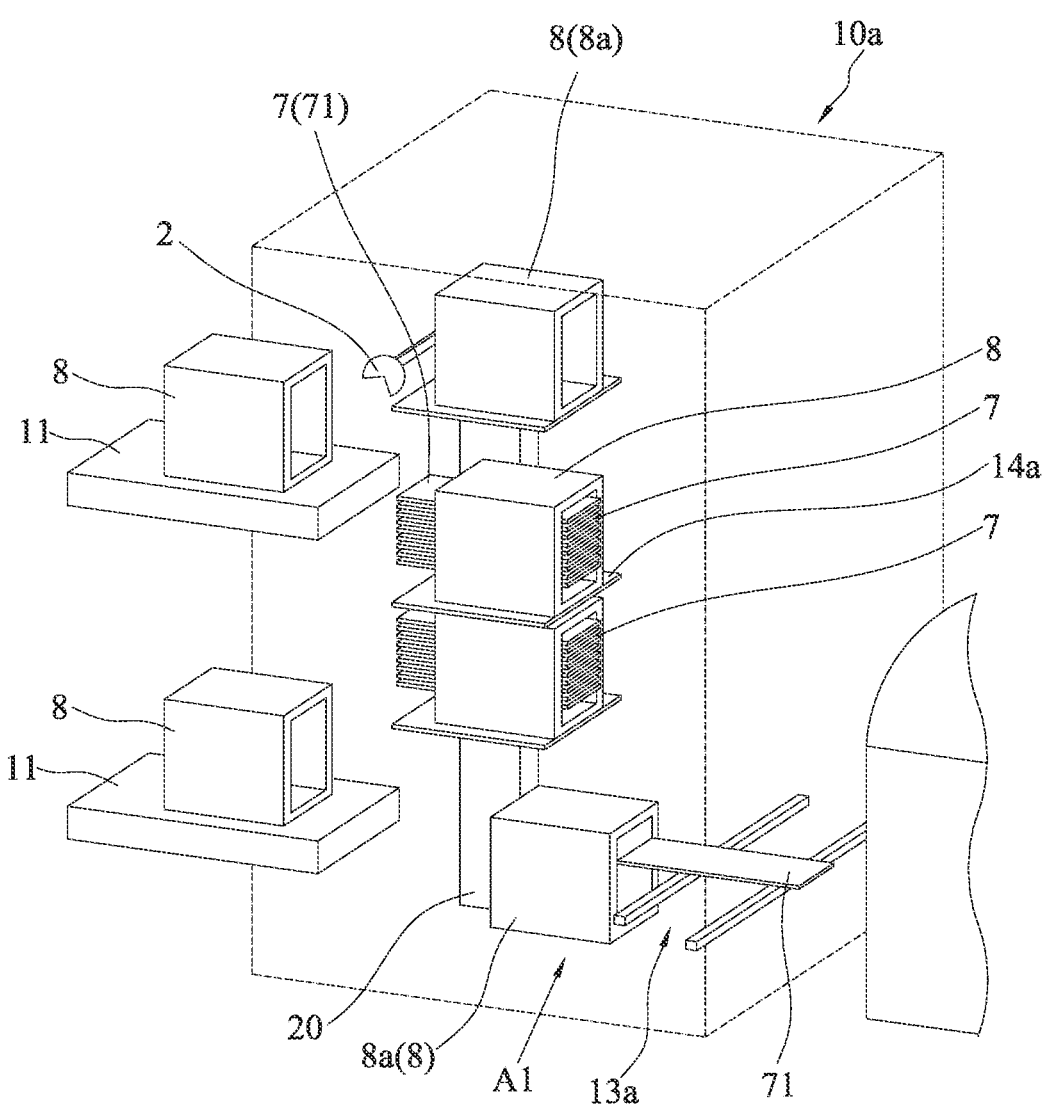
FIG. 5 is a schematic partially enlarged perspective view of FIG. 4.

Furthermore, there are various kinds of the pick-and-place device 2, such as the gripper that clamps up and down as shown in FIG. 1B, the gripper that clamps left and right as shown in FIG. 1C, the gripper that is fork-fixed as shown in FIG. 1D, the gripper that is engaged and clamped as shown in FIG. 1E, or the claw type gripper as shown in FIG. 1F, wherein as shown in FIG. 1B and FIG. 5, the pick-and-place device 2 can be configured with a three-axis moveable lifting structure 20 to set up grippers, and the lifting structure 20 can also be a multi-axis mechanical arm, as shown in FIG. 1D to FIG. 1F, to achieve the pick-and-place operations, but the present disclosure is not limited to as such.

For instance, as shown in FIG. 1B, the gripper clamps the upper and lower sides (clamping direction P as shown in FIG. 1B) of the magazine 8 with two forks, and the lifting structure 20 can linearly displace the gripper along the directions of up-and-down (Z-axis shown in FIG. 1B), left-and-right (Y-axis shown in FIG. 1B), and front-to-back (X-axis shown in FIG. 1B). As shown in FIG. 1C, the gripper clamps the left and right sides (clamping direction P as shown in FIG. 1C) of the magazine 8 with two forks, and the lifting structure 20 can also linearly displace the gripper along the directions of up-and-down, left-and-right and front-to-back. As shown in FIG. 1D, the distance between the two forks of the gripper is fixed and cannot be moved, and one side of the magazine 8 has a connecting head 80, so that the lifting structure 20 can move the gripper along a 360-degree orientation, such that the gripper (clamping direction P as shown in FIG. 1D) is able to fork the connecting head 80. As shown in FIG. 1E, the distance between the two forks of the gripper is moveable, and one side of the magazine 8 has a connecting bar 81, so that the lifting structure 20 can move the gripper along a 360-degree orientation, such that the two forks of the gripper move in opposite directions (clamping direction P as shown in FIG. 1E) to engage the inner side of the connecting bar 81. As shown in FIG. 1F, the gripper clamps (clamping direction P as shown in FIG. 1F) the connecting head 80 on one side of the magazine 8 with two curved claws, and the lifting structure 20 can move the gripper along a 360-degree orientation.

After the first distributor 13a transfers the carrier and/or the material to be processed 71 in the magazine 8 into the machine equipment 4 through the first operation area A1, the magazine 8 is emptied, so that the return device 3 transfers the magazine 8 in an empty box state of the input device 10a to at least any one of the second operation area A2, the second temporary storage port 14b, or the unload port 12 of the output device 10b. Further, the input device 10a and the output device 10b comprise a return area R1 and a return area R2 respectively for placing the empty magazines 8, and the return device 3 is connected to the return area R1 of the input device 10*a* and the return area R2 of the output device 10*b*.

Figure 3A:
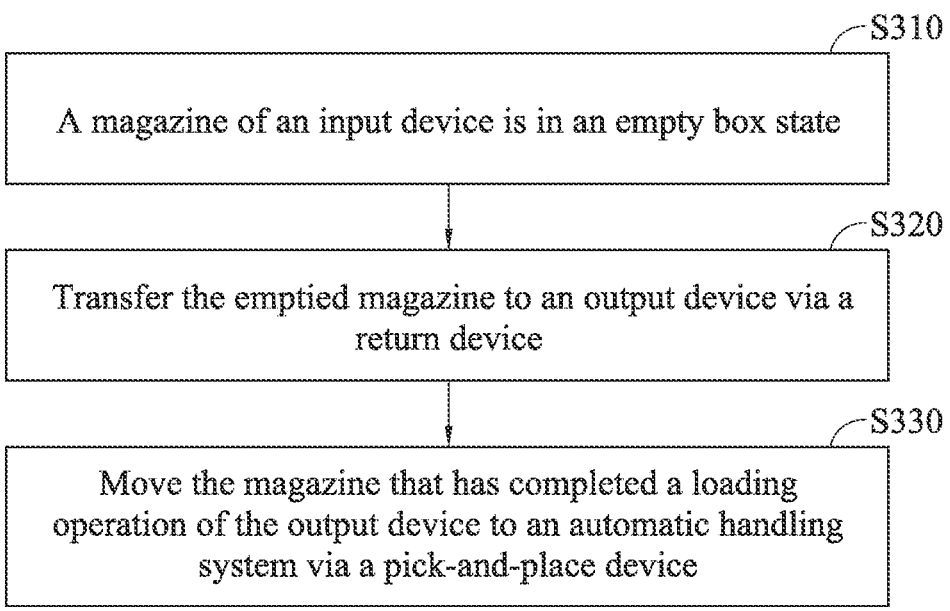
FIG. 3A is a flowchart illustrating an operation of a return mechanism of FIG. 2.
Figure 3B:
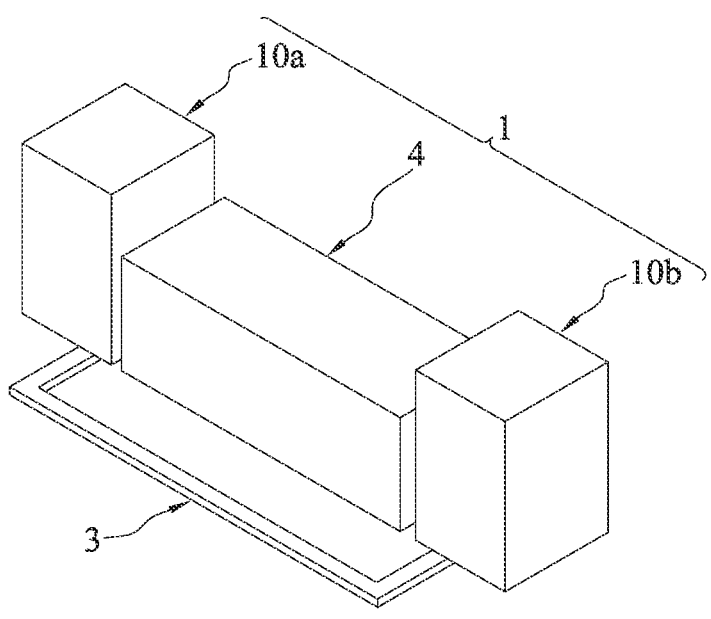
FIG. 3B, FIG. 3C, FIG. 3D and FIG. 3E are schematic perspective views illustrating different embodiments of the return device of FIG. 1A.
Figure 3C:
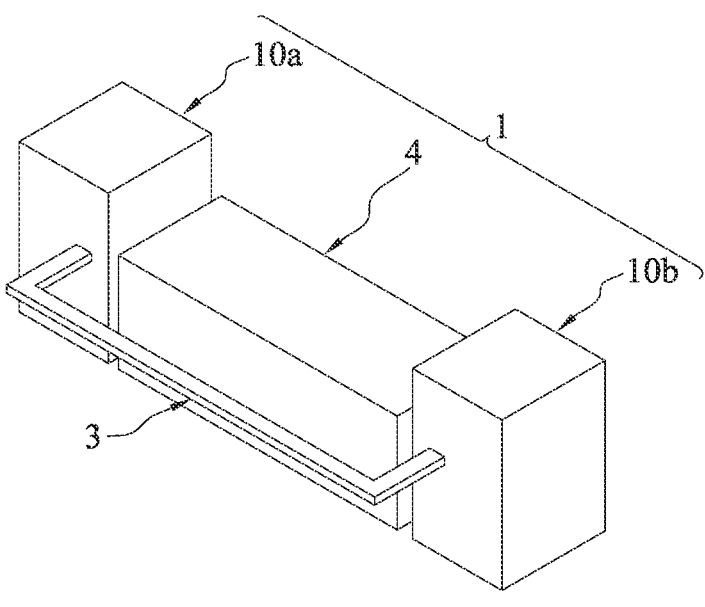
Figure 3D:
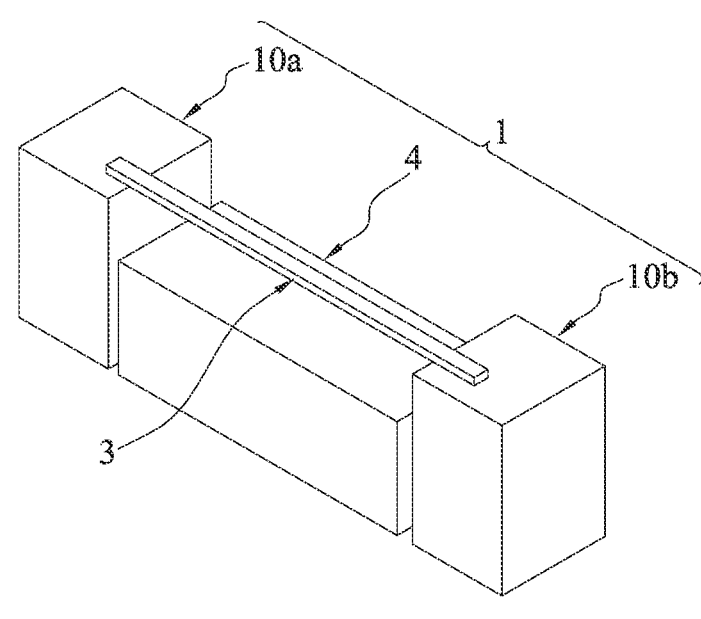
Figure 3E:
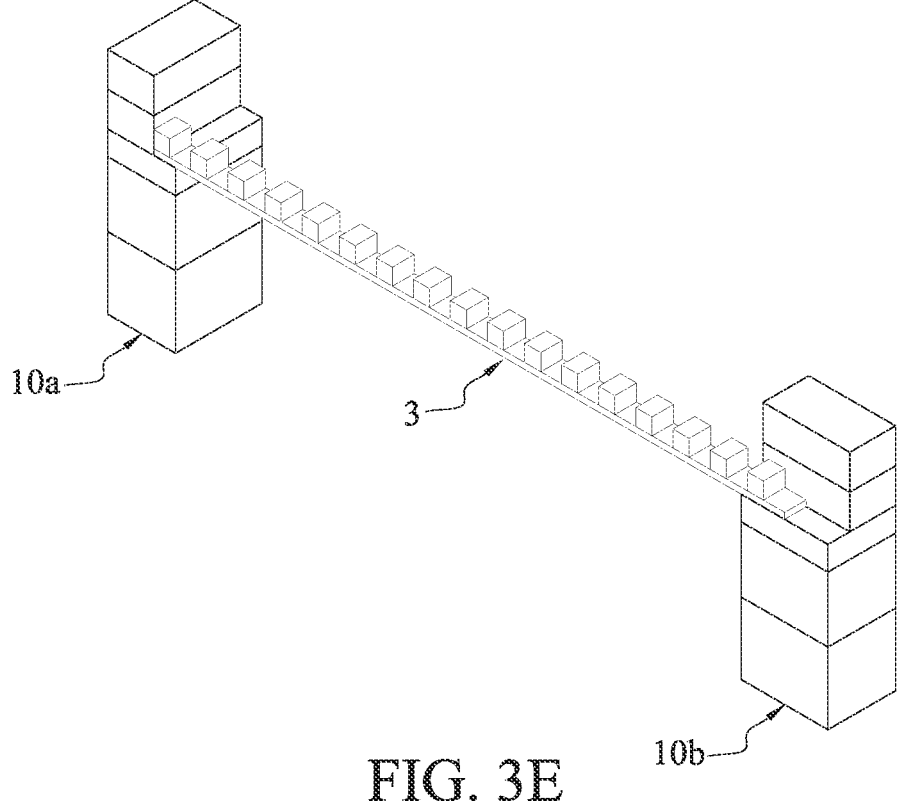

In an embodiment, there are various kinds of the return device 3, such as the ground slide rail shown in FIG. 3B, the side slide rail shown in FIG. 3C, the overhead slide rail (or conveyor belt) shown in FIG. 3D, or the maglev track shown in FIG. 3E, but not limited to the above.

Preferably, the return device 3 is an overhead slide rail (or conveyor belt) as shown in FIG. 3D. In this way, the return device 3 does not need to occupy the floor area of the factory area, and can be fixed on the ceiling of the factory area, and has better stability.

Therefore, the working system 1 of the present disclosure transports the magazine 8 in the empty box state of the input device 10*a* (the material-feeding end) to the output device 10*b* (the material-releasing end) by the design of the return device 3, so as to wait for the loading operation to take place. Hence, compared with the manual method of the prior art, the working system 1 of the present disclosure can save manpower because the return device 3 is used to automatically transport the magazine 8 in the empty box state to the material-releasing place after material feeding. In this way, the operation speed of the production line can be accelerated and the process cost can be reduced, which is beneficial to the mass production of the semiconductor product.

In addition, by the design of the pick-and-place device 2, the automatic handling or pick-and-place of the magazine 8 is carried out between the automatic handling system 9 and the working system 1. Therefore, the working system 1 of the present disclosure can save manpower and prevent damage to the processed material 72 caused by manpower. In this way, the operation speed of the production line can be accelerated and the process cost can be reduced, which is beneficial to the mass production of the semiconductor product.

Moreover, by the biaxial stepless movement design of the first distributor 13*a*, the movement distance error is reduced, so as to avoid the problem of frequent material jams in the subsequent process due to the positions of multiple objects (carriers or the target materials 7) being inconsistent with the process path of the machine equipment 4 when multiple carriers or the target materials 7 (such as the materials to be processed 71) enter the machine equipment 4 from the input device 10*a*.

Furthermore, by the design of the temporary storage port, when the production capacity (e.g., unit per hour, UPH) of the automatic handling system 9 needs to be improved, the first temporary storage port 14*a* can be provided at the input device 10*a* of the working system 1 and/or the second temporary storage port 14*b* can be provided at the output device 10*b* of the working system 1 for storing a plurality of the magazines 8 to be processed. Therefore, the time for the target material 7 to wait for entering and leaving the machine equipment 4 can be reduced, or the time for the automatic handling system 9 to wait for material feeding can be saved.

Figure 2:
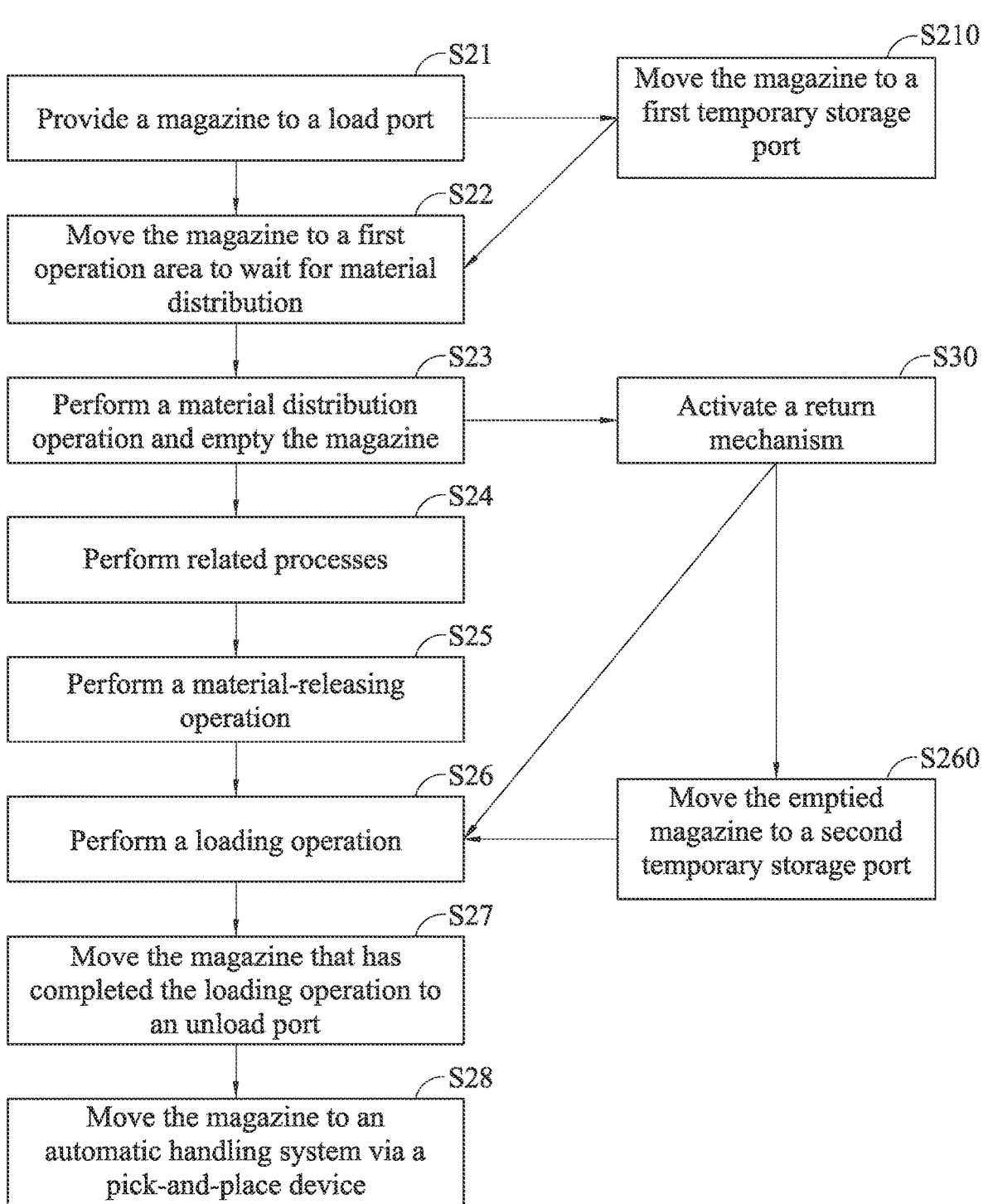
FIG. 2 is a flowchart illustrating an operation method of the working system for the semiconductor packaging process according to the present disclosure.

FIG. 2 is a flowchart illustrating an operation method of the working system 1 according to the present disclosure. In an embodiment, the production line is equipped with a plurality of workstations, and the operation of the workstations uses the working system 1.

In step S21, the magazine 8 is picked and placed from the automatic handling system 9 onto the load port 11 by the pick-and-place device 2, so that the magazine 8 enters the input device 10*a* via the load port 11.

In an embodiment, after the automatic handling system 9 is transported to the position of the working system 1, the automatic handling system 9 is communicatively connected to the working system 1 (such as the load port 11) via the communication equipment 90. After confirming that the delivery position has been aligned and the relevant information (such as the specification of the magazine 8) of the delivery item is correct, the pick-and-place device 2 is activated so that the pick-and-place device 2 transports the magazine 8 onto the load port 11.

It should be understood that by the design of the pick-and-place device 2, when the specification (such as the OHS specification) of the corresponding automatic handling system 9 does not have a built-in pick-and-place mechanism, the pick-and-place device 2 can be activated for automatic handling or pick-and-place.

In addition, in step S210, the magazine 8 on the load port 11 can be further moved to the first temporary storage port 14*a* according to requirements, so as to wait for entering the process operation of the machine equipment 4.

In step S22, the magazine 8 on the load port 11 (or the first temporary storage port 14*a*) is moved to the first operation area A1 to wait for material distribution.

In step S23, the material distribution operation is carried out to move the carrier and/or the target material 7 (such as the material to be processed 71) in the magazine 8 in the first operation area A1 to the first distributor 13*a*, so that a magazine 8*a* (as shown in FIG. 1A) in the first operation area A1 is in an empty box state (no carrier and/or target material 7).

In an embodiment, the magazine 8*a* in the empty box state of the input device 10*a* can be manually transported to the output device 10*b*, so as to wait for the target material 7 after being processed by the machine equipment 4 (such as the processed item or the processed material 72 that has completed the required process).

In another embodiment, the magazine 8*a* in an empty box state of the input device 10*a* can be transported to the output device 10*b* by the automatic handling system 9. For instance, the magazine 8*a* in the empty box state of the input device 10*a* is internally transferred to the load port 11, and then moved to the unload port 12 of the output device 10*b* by the automatic handling system 9, and then internally transferred to the required position; a new magazine 8*b* in an empty box state can also be transferred to the output device 10*b* by the automatic handling system 9, as shown in FIG. 1A, without transporting the empty magazine 8*a* originally used for the input device 10*a* to the output device 10*b*. It should be noted that using the automatic handling system 9 to transfer empty magazines will increase the working time of the automatic handling system 9 and prolong the operation time of the main production line.

Alternatively, the return mechanism can be activated by the return device 3, as shown in step S30, the magazine 8*a* in the empty box state is automatically transported to the output device 10*b*. For instance, the magazine 8*a* in the empty box state is internally transferred to the load port 11, and then moved to the unload port 12 of the output device 10*b* by the return device 3 (the return device 3 disposed on the bottom or side as shown in FIG. 3B and FIG. 3C), and then internally transferred to the required position; further, the input device 10*a* and the output device 10*b* also comprise the return area R1 and the return area R2 respectively for placing the magazine 8*a* in the empty box state, and the return device 3 (the return device 3 disposed on the top as shown in FIG. 3D and FIG. 3E) is connected to the return area R1 of the input device 10*a* and the return area R2 of the output device 10*b*. Using the return device 3 to transfer empty magazines is a better transfer method, which can be operated synchronously with the production line without affecting the operation time of the main production line.

In step S24, the carrier and/or the target material 7 (such as the material to be processed 71) in the magazine 8 are delivered to the process path (such as the processing platform) of the machine equipment 4 by the first distributor 13a, so that the machine equipment 4 performs related processes to process the carrier and/or the target material 7 (such as the material to be processed 71).

In an embodiment, the first distributor 13a moves the carrier and/or the target material 7 (such as the material to be processed 71) to align with the process path of the machine equipment 4 via a biaxial stepless moving structure, so that the first distributor 13a transfers the carrier and/or the target material 7 (such as the material to be processed 71) to the process path of the machine equipment 4.

In step S25, the material-releasing operation is performed, and the carrier and/or the target material 7 (such as the processed item or the processed material 72 that has completed the required process) processed by the machine equipment 4 are moved to the second distributor 13b.

In step S26, the processed carrier and/or the target material 7 (such as the processed material 72) are moved into the magazine 8a, 8b in the empty box state in the second operation area A2 by the second distributor 13b, so that the second operation area A2 acquires at least one magazine 8c loaded with the processed carrier and/or the target material 7 (such as the processed material 72), so as to complete the loading operation.

In an embodiment, the magazine 8 in the second operation area A2 is the magazine 8a in the empty box state from the input device 10a. For instance, the magazine 8a in the empty box state of the input device 10a is moved to the output device 10b in advance, and then moved to the second operation area A2 through the internal transfer operation of the output device 10b, and then the processed carrier and/or the target material 7 (such as the processed material 72) in the second distributor 13b are moved into the magazine 8a in the second operation area A2.

Moreover, the output device 10b can be designed with a temporary storage function according to requirements, as shown in step S260. For instance, the magazine 8a in the empty box state is moved from the return area R2 of the output device 10b to the second temporary storage port 14b, and then the magazine 8a of the second temporary storage port 14b is moved to the second operation area A2, so that the processed carrier and/or the target material 7 (such as the processed material 72) are loaded into the magazine 8a of the second operation area A2 via the second distributor 13b. It should be understood that the magazine 8a in the empty box state can be moved to the return area R2 by means of manpower, the return mechanism (such as the return device 3), or other methods, and then is moved to the second temporary storage port 14b via the internal transportation operation of the output device 10b.

In step S27, the magazine 8c that has completed the loading operation is moved from the second operation area A2 to the unload port 12.

In step S28, the magazine 8c of the processed carrier and/or the target material 7 (such as the processed material 72) are moved to the automatic handling system 9 by the pick-and-place device 2, such that the magazine 8c is output to the automatic handling system 9 via the unload port 12, so that the automatic handling system 9 transports the magazine 8c to the workstation of the subsequent process.

In an embodiment, the automatic handling system 9 is communicatively connected to the working system 1 (such as the unload port 12) via the communication equipment 90. After the workstation confirms that the delivery location has been aligned and the relevant information (such as the specification, quantity, and the like of the target material 7 placed in the magazine 8c) of the delivery item is correct, the pick-and-place device 2 is activated, so that the pick-and-place device 2 transports the magazine 8c from the unload port 12 to the automatic handling system 9.

It should be understood that by the design of the pick-and-place device 2, when the specification (such as OHS specification) of the corresponding automatic handling system 9 does not have a built-in pick-and-place mechanism, the pick-and-place device 2 can be activated for automatic handling or pick-and-place.

Furthermore, the magazine 8a, 8c (or carrier) of the output device 10b and the magazine 8, 8a (or carrier) of the input device 10a may be the same magazine/carrier. It should be understood that the magazines 8, 8b (or carriers) at the two locations may not be the same magazine/carrier, but the specifications are the same.

In addition, if the magazine 8a, 8c (or carrier) in the output device 10b is the same as the magazine 8, 8a (or carrier) of the input device 10a, then the return mechanism can be activated by using the return device 3 as shown in step S30, so that the magazine 8a (or carrier) in the empty box state is automatically transported from the input device 10a to the output device 10b.

FIG. 3A is a flowchart illustrating an operation flow of a return mechanism in step S30. In an embodiment, the return mechanism is operated by the return device 3.

In step S310, after step S23 is performed, the magazine 8a of the input device 10a is in an empty box state (no carrier or target material 7). At this time, the magazine 8a in the empty box state can be transferred to the return area R1 via the internal transfer operation of the input device 10a.

In step S320, the magazine 8a in the empty box state is transferred to at least any of the second operation area A2, the second temporary storage port 14b, or the unload port 12 of the output device 10b by the return device 3. In an embodiment, the magazine 8a in an empty box state is transferred to the return area R2 of the output device 10b, and then the magazine 8a in the empty box state is transferred to the second operation area A2 or the second temporary storage port 14b of the output device 10b via the internal transfer operation of the output device 10b.

In step S330, after completing the loading operation (such as step S26 to step S27), the magazine 8, 8c that has completed the loading operation of the output device 10b is moved to the automatic handling system 9 by the pick-and-place device 2.

Therefore, the working system 1 of the present disclosure is connected to the input device 10a and the output device 10b via the return device 3, so that an automatic transfer of the magazine 8a required for the loading operation is completed by moving the magazine 8a in the empty box state from the input device 10a to the output device 10b.

It can be understood that the internal transfer operation between the input device 10a and the output device 10b can also be achieved by using the pick-and-place device 2, and the input device 10a and the output device 10b can be configured with a plurality of the pick-and-place devices 2 to meet the transfer operation between a plurality of internal areas.

To sum up, the working system of the present disclosure and the operation method thereof use the design of the return device, so that the magazine in the empty box state of the input device is transferred to the output device to wait for the loading operation. Therefore, the working system of the present disclosure can save manpower because the return device is used to automatically transport the magazine in the empty box state to the material-releasing place after material feeding. In this way, the operation speed of the production line can be accelerated and the process cost can be reduced, which is beneficial to the mass production of the semiconductor product.

The above embodiments are set forth to illustrate the principles of the present disclosure and the effects thereof, and should not be interpreted as to limit the present disclosure. The above embodiments can be modified by one of ordinary skill in the art without departing from the scope of the present disclosure as defined in the appended claims. Therefore, the scope of protection of the right of the present disclosure should be listed as the following appended claims.

What is claimed is:

1. A working system for a semiconductor packaging process, comprising:
    a machine equipment defined with a process starting end, a process ending end, and a process path connected to the process starting end and the process ending end;
    a supply unit correspondingly connected to the machine equipment and including an input device connected to the process starting end of the machine equipment and an output device connected to the process ending end of the machine equipment, wherein the input device is configured with a magazine for carrying a target material; and
    a return device connected to the input device and the output device to transport the magazine from the input device to the output device,
    wherein the output device has at least one unload port, and the magazine in the output device is output to outside via the unload port,
    wherein the output device further has at least one second distributor that cooperates with operation of the machine equipment, and the second distributor is used to distribute the target material processed by the machine equipment into the magazine and corresponds to the process path of the machine equipment,
    wherein the output device further has at least one second operation area connected to the unload port for placing the magazine, wherein the second distributor processes the target material processed by the machine equipment into the magazine in the second operation area, and the magazine is moved to the unload port via the second operation area.

2. The working system of claim 1, wherein the input device has at least one load port, and the magazine is moved from outside to the load port.

3. The working system of claim 2, wherein the return device is connected to the load port to transport the magazine from the load port to the output device.

4. The working system of claim 2, wherein the input device further has at least one first distributor that cooperates with operation of the machine equipment, and the first distributor is used to distribute the target material in the magazine and corresponds to the process path of the machine equipment.

5. The working system of claim 4, wherein the input device further has at least one first operation area connected to the load port, and the magazine is moved to the first operation area via the load port, such that the target material in the magazine in the first operation area is processed by the first distributor.

6. The working system of claim 5, wherein the input device has a first temporary storage port connected to the first operation area and the load port.

7. The working system of claim 1, wherein the input device has a return area connected to the return device, and the magazine is transported from the return area to the output device.

8. The working system of claim 1, wherein the return device is connected to the unload port to transport the magazine from the input device to the unload port.

9. The working system of claim 1, wherein the output device has a second temporary storage port connected to the second operation area and the unload port.

10. The working system of claim 1, wherein the output device has a return area, and the magazine is transported from the input device to the return area.

11. An operation method of a working system for a semiconductor packaging process, comprising:
    providing the working system of claim 1;
    picking and placing the magazine from an automatic handling system into the input device;
    transferring the target material in the magazine to the process path of the machine equipment via the input device, so that the machine equipment processes the target material;
    transporting the magazine from the input device to the output device via the return device;
    moving the target material processed by the machine equipment to the output device via the output device;
    loading the processed target material into the magazine in the output device via the output device; and
    moving the magazine with the processed target material in the output device to the automatic handling system,
    wherein the output device has at least one unload port, and the magazine having the processed target material is output to the automatic handling system via the unload port,
    wherein the output device further has at least one second distributor that cooperates with operation of the machine equipment, and the target material processed by the machine equipment is moved to the output device,
    wherein the output device further has at least one second operation area connected to the unload port for placing the magazine, wherein the second distributor loads the processed target material into the magazine in the second operation area, and the magazine is moved to the unload port via the second operation area.

12. The operation method of the working system of claim 11, wherein the input device has at least one load port, and the magazine is moved from the automatic handling system to the input device via the load port.

13. The operation method of the working system of claim 12, wherein the return device is connected to the load port to transport the magazine from the load port to the output device.

14. The operation method of the working system of claim 12, wherein the input device further has at least one first distributor that cooperates with operation of the machine equipment, and the target material in the magazine is transferred to the process path of the machine equipment.

15. The operation method of the working system of claim 14, wherein the input device further has at least one first operation area, and the magazine is moved to the first operation area via the load port, such that the target material in the magazine in the first operation area is processed by the first distributor.

16. The operation method of the working system of claim 15, wherein the input device has a first temporary storage port connected to the first operation area and the load port, and the magazine on the load port is moved to the first temporary storage port.

17. The operation method of the working system of claim 11, wherein the input device has a return area connected to the return device, and the magazine is transported from the return area to the output device.

18. The operation method of the working system of claim 11, wherein the return device is connected to the unload port to transport the magazine from the input device to the unload port.

19. The operation method of the working system of claim 11, wherein the output device has a second temporary storage port connected to the second operation area and the unload port, and the magazine of the output device waiting to load the processed target material is temporarily stored in the second temporary storage port.

20. The operation method of the working system of claim 11, wherein the output device has a return area, and the magazine is transported from the input device to the return area.

* * * * *